(12) United States Patent
Kishida

(10) Patent No.: US 7,199,668 B2
(45) Date of Patent: Apr. 3, 2007

(54) INTEGRATED CIRCUIT AND OPTICAL PICKUP DEVICE

(75) Inventor: Tomotake Kishida, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/944,240

(22) Filed: Sep. 16, 2004

(65) Prior Publication Data
US 2005/0062544 A1   Mar. 24, 2005

(30) Foreign Application Priority Data
Sep. 19, 2003   (JP) .............................. 2003-328527
Jun. 22, 2004   (JP) .............................. 2004-184184

(51) Int. Cl.
*H03F 3/04*   (2006.01)

(52) U.S. Cl. ....................................... 330/311; 330/308

(58) Field of Classification Search ................ 330/308, 330/149; 250/214 A; 257/537–538
See application file for complete search history.

(56) References Cited

U.S. PATENT DOCUMENTS

| 3,972,002 A * | 7/1976 | Aprille, Jr. ................... 330/294 |
| 6,838,323 B2 * | 1/2005 | Gauthier et al. ............ 438/155 |
| 6,861,910 B2 * | 3/2005 | Karasudani ................. 330/311 |
| 6,952,136 B2 * | 10/2005 | Gupta ........................ 330/308 |

FOREIGN PATENT DOCUMENTS

JP   2003-37446   2/2003

* cited by examiner

*Primary Examiner*—Robert Pascal
*Assistant Examiner*—Hieu Nguyen
(74) *Attorney, Agent, or Firm*—Morrison & Foerster LLP (57) ABSTRACT

An integrated circuit includes a first-stage amplifier circuit and a following-stage amplifier circuit connected in series, a common power source pad for supplying power to the amplifier circuits, and metal wires respectively connecting the common power source pad to the amplifier circuits. On the metal wire which connects the first-stage amplifier and the power source pad, an integrator is electrically connected. This arrangement decreases a coupling noise generated in the first-stage amplifier circuit, thereby stabilizing circuit operation of the following-stage amplifier circuit.

15 Claims, 5 Drawing Sheets

INTEGRATED CIRCUIT AND OPTICAL PICKUP DEVICE

This nonprovisional application claims priority under 35 U.S.C. § 119(a) on Patent Application No. 2003/328527 filed in Japan on Sep. 19, 2003, and Patent Application No. 2004/184184 filed in Japan on Jun. 22, 2004. The entire contents of these applications are hereby incorporated by reference.

FIELD OF THE INVENTION

The present invention relates to an integrated circuit including a plurality of amplifiers connected in series. The present invention is particularly suitable for an optical pickup device including an integrated circuit which includes (i) a plurality of amplifiers for sequentially increasing gain and (ii) a circuit having large gain, and more suitable for an integrated circuit which especially requires a high-frequency characteristic.

BACKGROUND OF THE INVENTION

Optical discs are widely used as mediums for recording sounds, videos, document data, and the like. There have been developed various kinds of devices for recording or reproducing information to or from optical discs.

Such a device includes an optical pickup device as a main component. At a forefront of the device, the optical pickup device receives an optical signal (laser signal) from an optical disc, converts the optical signal into an electrical signal, and outputs the electrical signal. More specifically, the optical pickup device is a main component which receives a laser beam reflected on the optical disc, converts the laser beam into an electrical signal (current) through a light-receiving element (photodiode), converts the electrical signal into a voltage through a gain resistor provided in a circuit connected to the light-receiving element, and outputs the voltage to an LSI provided downstream.

Figure 7:
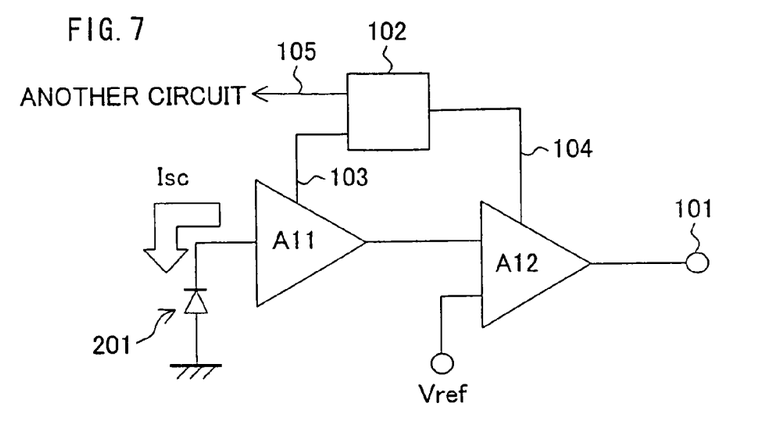
FIG. 7 is a block diagram illustrating an arrangement of a main part of a conventional integrated circuit.
Figure 8:
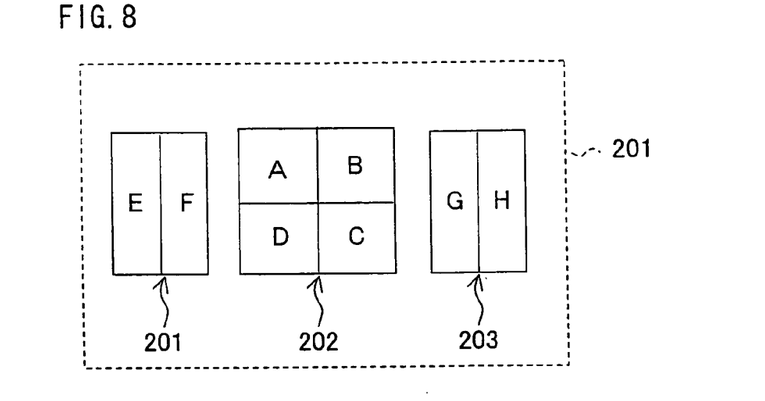
FIG. 8 is a schematic diagram illustrating a light-receiving section of a generally used light-receiving element.

In general, the current obtained by conversion through the light-receiving element is very weak. It is therefore necessary to amplify the current through an amplifier circuit (light-receiving amplifier element). FIG. 7 illustrates an equivalent circuit of a generally used light-receiving amplifier element. FIG. 8 illustrates a shape and a position of a light-receiving section of the light-receiving element.

In the generally used amplifier element, as shown in FIG. 7, an electrical signal Isc obtained by conversion through a light-receiving element 201 is amplified by two serially connected amplifier circuits (a first-stage amplifier circuit A11 and a following-stage amplifier circuit A12).

As shown in FIG. 8, the light-receiving element 201 includes main light-receiving sections 202 (A through D) and sub light-receiving sections 203 (E through H). The main light-receiving sections 202 are four regions provided at the center of the light-receiving element 201. The sub light-receiving sections 203 are provided on the right and left of the main light-receiving sections 202. In the optical pickup device, an electrical signal obtained by conversion through the main light-receiving sections 202 is used for performing a focus adjustment and reproducing a data signal, and an electrical signal obtained by conversion through the sub light-receiving sections 203 is used for performing a tracking adjustment.

During operation of the optical pickup device, each of the main light-receiving sections 202 and of the sub light-receiving sections 203 is irradiated with the laser beam reflected on the optical disc. Therefore, an output terminal of the light-receiving element 201 is active. That is, as shown in FIG. 7, the laser signal is converted into the electrical signal Isc through the light-receiving element 201, the electrical signal Isc is subjected to current-to-voltage conversion and amplification through the first-stage amplifier circuit A11, and then to voltage amplification through the following-stage amplifier circuit A12, and is outputted from an output terminal 101.

Figure 9:
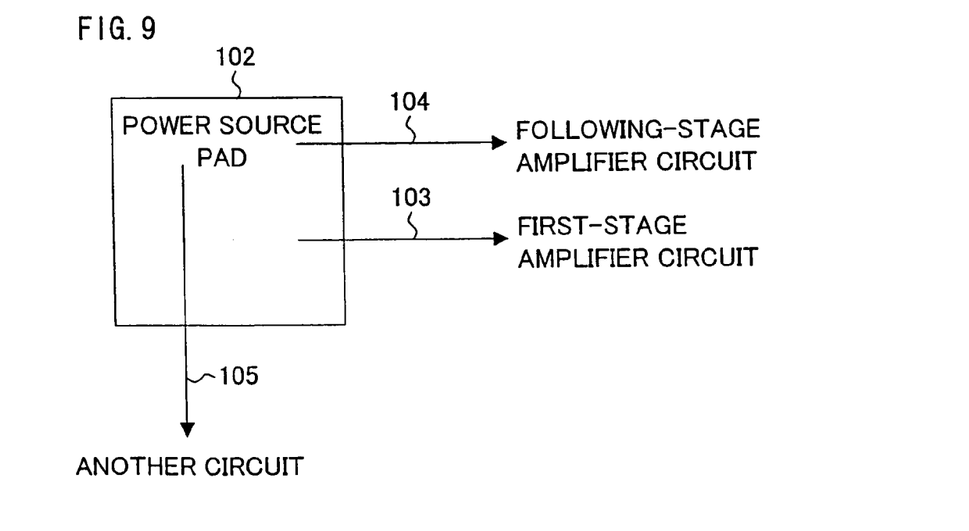
FIG. 9 is a block diagram illustrating an arrangement of a main part of the integrator provided in the integrated circuit of FIG. 7.

In order to stabilize operation of the circuit as a whole, it is necessary that the light-receiving amplifier element including the serially connected amplifier circuits be free from a noise or oscillations on power supply lines, and other problems. For this purpose, in the light-receiving amplifier element of FIG. 7, the amplifier circuits (A11 and A12) and another circuit are provided with metal wires 103 through 105, which are separate power supply lines for supplying power from a power source pad 102. For example, the following Patent Publication 1 describes an arrangement of supplying power through separate power supply lines to a plurality of serially connected amplifier circuits. FIG. 9 illustrates a schematic diagram of the power supply lines (metal wires) in the vicinity of the power source pad 102.

[Patent Publication 1]

Japanese Publication for Unexamined Patent Publication, Tokukaihei 2003-37446 (publication date: Feb. 7, 2003)

In the example of FIG. 9, power supply lines connecting the power source pad 102 with each circuit are provided independently, so as to reduce the noise on the power supply lines. Specifically, the metal wire 103 is provided for supplying power to the first-stage amplifier circuit; the metal wire 104 is provided for supplying power to the following-stage amplifier circuit, and the metal wire 105 is provided for supplying power to the another circuit.

In a multi-stage amplifier circuit including a plurality of serially connected amplifier circuits as described above, a coupling noise is generated by a rapid voltage fluctuation at an output terminal of the first-stage amplifier circuit. Therefore, according to the foregoing circuit arrangement, not only an amplified signal but also the voltage fluctuation caused in the first-stage amplifier circuit is supplied to the following-stage amplifier circuit through the power source pad 102. As a result, circuit operation is destabilized.

The coupling noise is generated for various reasons. A salient reason is that a metal layer and an insulating layer, which are laminated in the integrated circuit, are not jointed properly. In forming capacitors and resistors in an integrated state on a chip, a large number of metal layers and insulating layers are laminated. In this case, if there is a defective portion where a metal layer and an insulating layer are not jointed properly, the defective portion generates a noise (hereinafter "junction noise").

The integrated circuit is also affected electrically by a noise generated outside the integrated circuit (noise generated by life environment; hereinafter "external noise")

The term "coupling noise" is a generic term of the junction noise and the external noise.

It is because the coupling noise destabilizes the power sources (Vcc, Vref) that the rapid voltage fluctuation is caused at the output terminal of the first-stage amplifier circuit as described above. The rapid voltage fluctuation at the output terminal further generates the coupling noise, thereby creating a vicious circle.

SUMMARY OF THE INVENTION

The present invention was made in light of the foregoing problem. An object of the present invention is therefore to provide an integrated circuit capable of reducing a coupling noise generated in a first-stage amplifier circuit among a plurality of serially connected amplifier circuits (amplifiers), thereby stabilizing circuit operation of a following-stage amplifier.

In order to attain the foregoing object, an integrated circuit of the present invention includes a plurality of amplifiers connected in series; power supply lines connected to a common power source, the power supply lines respectively supplying power to the amplifiers; and noise reducing means for reducing a noise generated in a first-stage amplifier among the amplifiers.

According to this arrangement, the noise reducing means reduces the noise generated in the first-stage amplifier, thereby preventing the noise from being supplied to a following-stage amplifier through the common power source, which is shared by the first-stage amplifier and the other amplifiers.

As a result, operation of the integrated circuit as a whole is stabilized, because the noise generated in the first-stage amplifier, e.g. the coupling noise, does not destabilize operation of the following-stage amplifier.

The noise reducing means may be an integrator including a resistor and a capacitor.

If the noise reducing means is the integrator including a resistor and a capacitor, it is easy to incorporate the noise reducing means into the integrated circuit.

In addition, because the integrator includes the resistor and the capacitor, the integrator can be formed easily by using existing elements.

For a fuller understanding of the nature and advantages of the invention, reference should be made to the ensuing detailed description taken in conjunction with the accompanying drawings.

DESCRIPTION OF THE EMBODIMENTS

The following describes one embodiment of the present invention. In the present embodiment, described as one example of the integrated circuit of the present invention is a light-receiving amplifier element provided to an optical pickup device.

Figure 1:
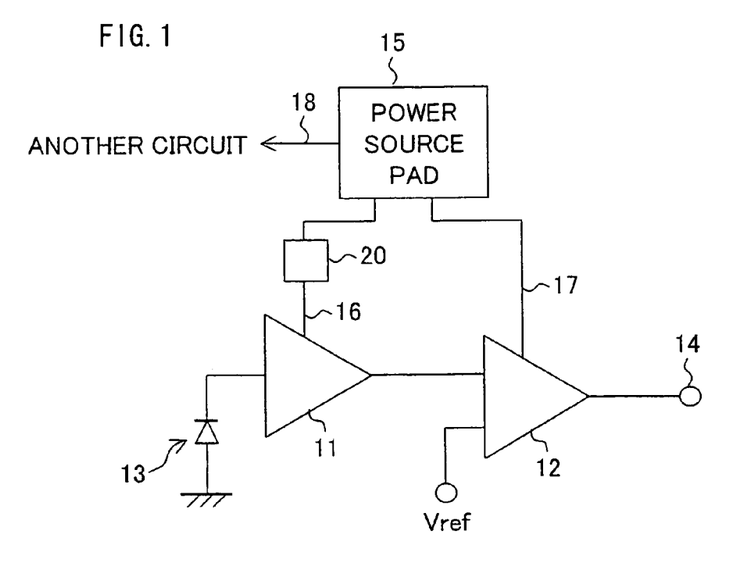
FIG. 1 is a block diagram illustrating an arrangement of a main part of an integrated circuit as one embodiment of the present invention.

FIG. 1 is a schematic block diagram illustrating the light-receiving amplifier element of the present embodiment.

As shown in FIG. 1, the light-receiving amplifier element of the present embodiment includes a first-stage amplifier circuit 11, a following-stage amplifier circuit 12, and a light-receiving element 13. The following-stage amplifier circuit 12 is connected to an output side of the first-stage amplifier circuit 11. The light-receiving element 13 is connected to an input side of the first-stage amplifier circuit 11. The first-stage amplifier circuit 11 and the following-stage amplifier circuit 12 are connected in series. An electrical signal generated by conversion through the light-receiving element 13 is amplified to a predetermined level through the first-stage amplifier circuit 11 and the following-stage amplifier circuit 12, and then outputted from an output terminal 14.

The light-receiving amplifier element also includes a power source pad 15 for supplying power to the first-stage amplifier circuit 11 and to the following-stage amplifier circuit 12. The power source pad 15 is connected to the circuits 11, 12, and another circuit through metal wires (power supply lines) 16 through 18. Specifically, the metal wire 16 is connected to the first-stage amplifier circuit 11; the metal wire 17 is connected to the following-stage amplifier circuit 12; and the metal wire 18 is connected to the aforesaid another circuit (not shown).

The metal wire 16 is connected to an integrator (noise reducing means) 20 for cutting a coupling noise, which is described later. Specifically, the integrator 20 is connected on the power supply line (metal wire 16) which connects the power source pad 15 and the first-stage amplifier circuit 11.

Figure 2:
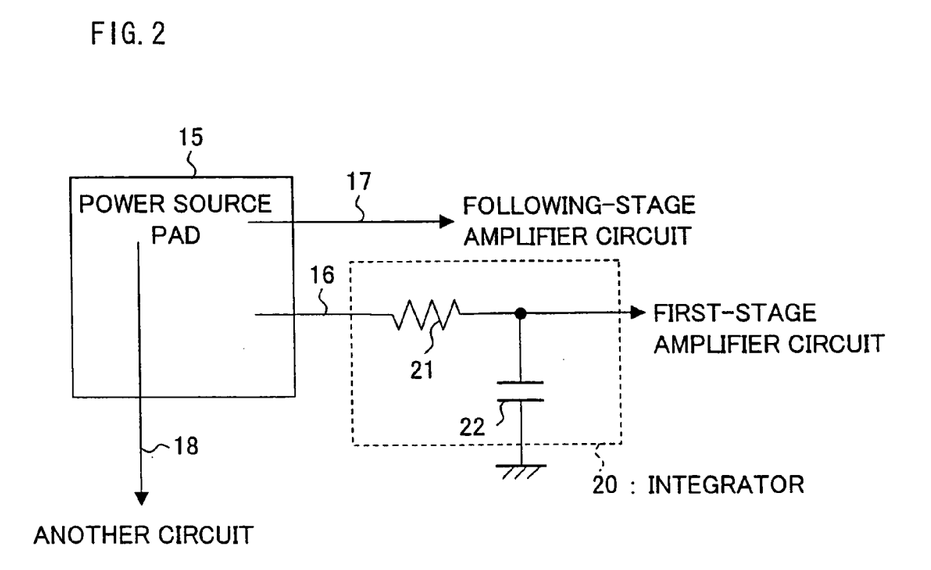
FIG. 2 is a block diagram illustrating an arrangement of a main part of an integrator provided in the integrated circuit of FIG. 1.

FIG. 2 is a schematic block diagram illustrating details of the integrator 20.

As shown in FIG. 2, the integrator 20 includes a resistor section 21 and a capacitor section 22. The resistor section 21 includes a resistor element provided on the metal wire 16. The capacitor section 22 includes a capacitor element provided between the resistor section 21 and the first-stage amplifier circuit 11. One end of the capacitor section 22 is connected to the metal wire 16, and the other end of the capacitor section 22 is grounded.

According to the light-receiving amplifier element arranged in this manner, the coupling noise generated in the first-stage amplifier circuit 11 is cut by the integrator 20 connected to the metal wire 16. Therefore, the coupling noise does not return to the power source pad 15 through the metal wire 16. As a result, the power supplied to the following-stage amplifier circuit 12 is free from the coupling noise. This stabilizes operation of the following-stage amplifier circuit 12.

The coupling noise is generated by a rapid voltage fluctuation at an output terminal of the first-stage amplifier circuit 11. In particular, if a high-frequency noise not lower than a certain frequency is supplied to a circuit, operation of the circuit is generally destabilized. To avoid this problem, the integrator 20, which is provided between the first-stage amplifier circuit 11 and the power source pad 15, is designed to release the noise not lower than a certain frequency (high-frequency noise) to the ground through the capacitor section 22. As a result, the high-frequency noise, which would destabilize circuit operation, does not return to the power source pad 15.

Thus, the integrator 20 is at least designed to release such a noise that would destabilize the circuit operation.

According to the present invention, the integrator 20 provided between the first-stage amplifier circuit 11 and the power source pad 15 stabilizes the circuit operation. Therefore, it is not required to provide a noise decreasing element, such as a bypass capacitor, on the power supply line 17 connecting the following-stage amplifier circuit 12 and the power source pad 15.

A frequency (f) of a noise which can be removed through the integrator 20 is determined by a resistance (R) of the resistor section 21 and a capacitance (C) of the capacitor section 22. In general, the frequency of the noise which can be removed is determined by the following formula: $f = (1/2)\pi RC$. In the present invention, the noise to be removed is not lower than 100 MHz, for example.

Figure 3:
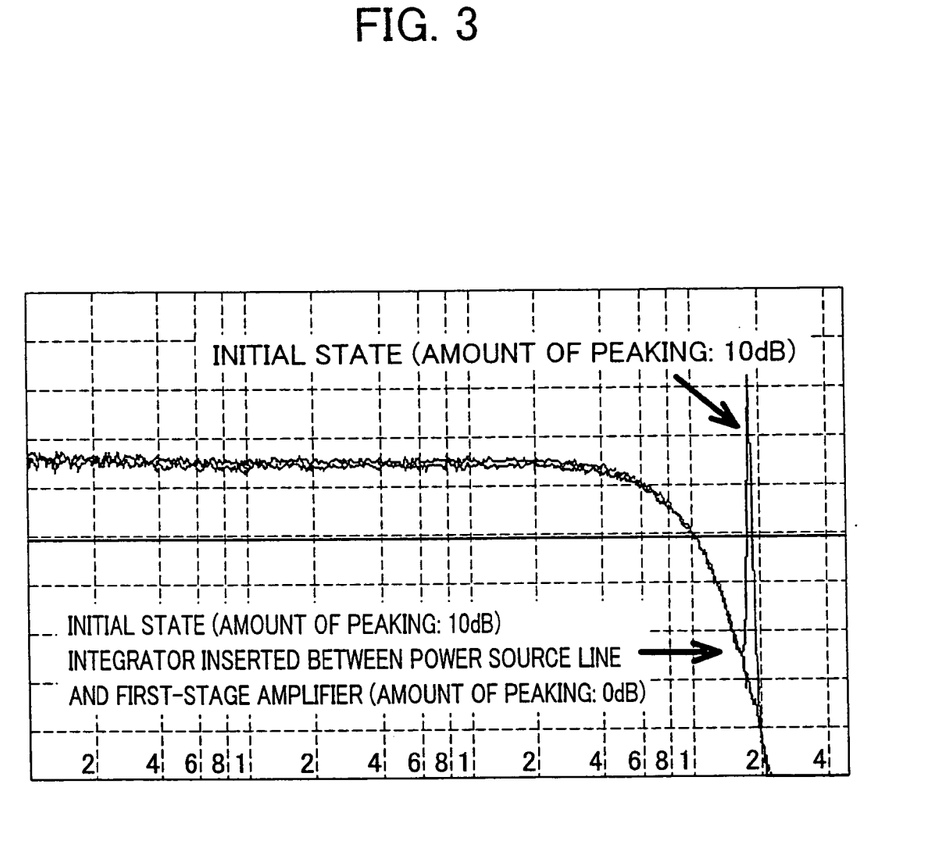
FIG. 3 is a graph comparing a frequency characteristic of an integrated circuit provided with the integrator and a frequency characteristic of an integrated circuit not provided with the integrator.

With reference to FIG. 3, the following discusses how the noise is generated in a case where the integrator 20 is provided and in a case where the integrator 20 is not provided. FIG. 3 is a graph illustrating frequency response characteristics of a signal flowing on the metal wire 16 which connects the first-stage amplifier circuit 11 and the power source pad 15. The graph of FIG. 3 is obtained by measuring frequency characteristics of an output from an output terminal 14 supplied with the noise. The measurement was conducted under the following conditions: (1) two power supply voltages (Vcc power source=5V, and Ver power source=2.1V (Vref in FIG. 1 applied to the following-stage amplifier circuit 12)) were applied to a measurement chip (the target of measurement; the integrated circuit arranged as shown in FIG. 1); and (2) a spectrum analyzer was used with a resistor (10 kΩ) and a capacitor (10 pF) provided to an output terminal of the measurement chip as loads.

The Vcc power source generates a power supply voltage of the power source pad 15, and the Ver power source generates Vref (FIG. 1) applied to the following-stage amplifier circuit 12.

In the graph of FIG. 3, if the integrator 20 is not inserted (conventional art), an amount of peaking which appears as a noise component on the right of the graph is 10 dB. This indicates that the signal includes the noise component. On the other hand, if the integrator 20 is inserted, the amount of peaking is 0 dB. This indicates that the signal includes no noise component. The circuit is oscillating when the amount of peaking, which indicates an amount of noise component, is large.

In the light-receiving amplifier element arranged in the foregoing manner, the following-stage amplifier circuit 12 does not receive the coupling noise from the first-stage amplifier circuit 11, because the integrator 20 is inserted between the first-stage amplifier circuit 11 and the power source pad 15. This stabilizes the operation of the following-stage amplifier circuit 12, thereby stabilizing operation of the light-receiving amplifier element as a whole.

When the operation of the light-receiving amplifier element as a whole is stabilized, operation of the optical pickup device including the light-receiving amplifier element is also stabilized.

Therefore, in the optical pickup device, when a received optical signal is converted into an electrical signal, the electrical signal is appropriately outputted from the light-receiving amplifier element (integrated circuit). As a result, various kinds of control (e.g. focusing control, tracking control, and the like) can be performed at high accuracy, in accordance with the received optical signal.

Therefore, if the optical pickup device arranged in the foregoing manner is mounted to a CD (Compact Disc) player or the like device, it is possible to reproduce signals with improved quality. With such devices provided with the optical pickup device, it is possible to reproduce signals with improved quality from information stored in a storage medium.

The light-receiving amplifier element may include, as shown in FIG. 1, one set of two amplifier circuits including a light receiving element. Alternatively, the light-receiving amplifier element may include plural sets of the two amplifier circuits including a light receiving element. In the latter case, the same effect as in the case of one set of two amplifier circuits can be attained if the integrator is provided in each set between the first-stage amplifier circuit and the power source pad.

Figure 4:
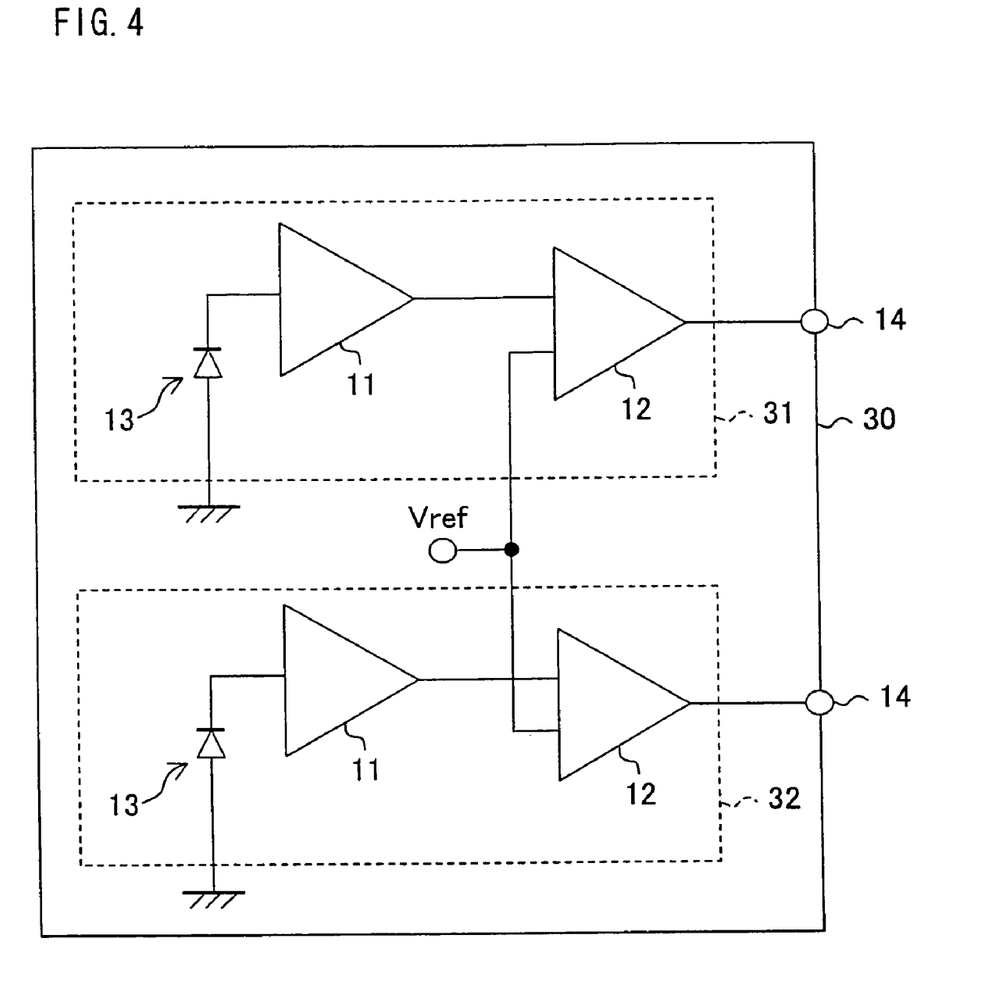
FIG. 4 is a block diagram illustrating another example of the integrated circuit of the present invention.

Specifically, the light-receiving amplifier element may be arranged as shown in FIG. 4, where a first block 31 and a second block 32 are formed on the same insulating substrate 30, each of the first block 31 and the second block 32 including the first-stage amplifier circuit 11 and the following-stage amplifier circuit 12 connected in series. To the following-stage amplifier circuit of each block, a common reference voltage Vref is applied.

The number of the amplifier circuits connected in series is not limited to two as in FIGS. 1 and 4; the number may be three or more. In any case, it is a problem if the following-stage amplifier circuit receives, through the power source pad, the noise generated in the first amplifier circuit. Therefore, as long as the integrator for cutting the noise is provided between the first-stage amplifier circuit and the power source pad, the number of the amplifier circuits connected in series may be three or more.

Moreover, the number of blocks formed on the same insulating substrate 30 is not limited to two as in FIG. 4; the number may be three or more.

Within each block, the integrator 20 (not shown) for cutting the noise generated in the first-stage amplifier circuit is provided as in FIG. 1. The integrator 20 includes the resistor section 21 and the capacitor section 22, as shown in FIG. 2. If these elements (the resistor section 21 and the capacitor section 22) are provided separately within an IC chip of the light-receiving amplifier element, chip area is increased. Moreover, if the number of blocks is increased as described above, the number of the integrator is increased accordingly, resulting in further increase of the chip area.

However, with the following arrangement, the integrator can be formed by using existing elements, without increasing the chip area.

Figures 5A, 5B:
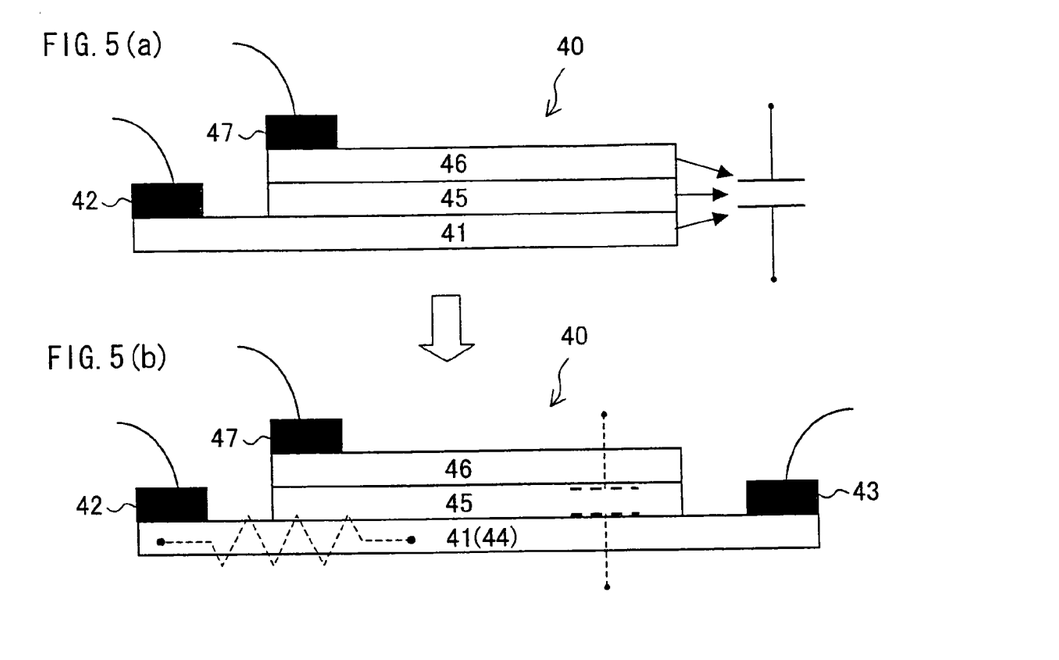
FIG. 5(a) is a schematic cross-sectional view illustrating a capacitor element of the integrated circuit.
FIG. 5(b) is a schematic cross-sectional view illustrating the capacitor element of FIG. 5(a) in a case where the capacitor element is used to form the integrator.

In general, a capacitor element (circuit element other than the integrator in the integrated circuit) in the chip is often provided near the power source pad or near an output terminal pad. Therefore, if metal wires connected to the power source are arranged appropriately, the capacitor element can be used as the integrator. Specifically, a capacitor element usually provided in the chip as a spare, for such purposes as filling a gap between elements, cutting a noise on the power supply lines, or being used as a phase-compensating capacitor in the circuit, can be used as the integrator. With reference to FIGS. 5(a) and 5(b), an integrator using such a capacitor element is described below. The capacitor element provided as a spare is used if necessary; otherwise, it is electrically isolated.

FIG. 5(a) is a schematic cross-sectional view illustrating one example of the capacitor element, and FIG. 5(b) is a schematic cross-sectional view illustrating an example where the resistor section and the capacitor section of the integrator are formed by using the capacitor element.

As shown in FIG. 5(a), a lower metal region 41 is provided at a lower part of a capacitor element 40, and an upper metal region 46 is provided at an upper part of the capacitor element 40. Usually, the capacitor element 40 is used as follows: a lower electrode 42 is drawn from the lower metal region 41, and an upper electrode 47 is drawn from the upper metal region 46. There is an insulating layer 45 between the upper metal region 46 and the lower metal region 41. Thus, the capacitor element 40 usually includes the upper electrode 47, the upper metal region 46, the insulating layer 45, the lower metal region 41, and the lower electrode 42.

Discussed next is how to form the resistor section, which is one of the constituting elements of the integrator. As described above, in FIG. 5(a), the lower electrode 42 is drawn from the lower metal region 41 of the capacitor element 40. If, as shown in FIG. 5(b), a lower electrode 43 is drawn from the other end of the lower metal region 41, the other end being opposite the end from which the lower electrode 42 is drawn, the lower metal region 41 becomes a resistor part 44, which can be used as the resister section 21 of the integrator 20. By replacing the lower metal region 41 with a diffusion region of a semiconductor layer, the resistance can be increased.

As shown in FIG. 5(b), the capacitor section 22 of the integrator 20 includes the upper electrode 47, the upper metal region 46, the insulating layer 45, the lower metal region 41, and the lower electrode 42. The resistor section 21 of the integrator 20 includes the lower electrode 42, the lower metal region 41, and the lower electrode 43.

In the arrangement of FIG. 1, the lower electrode 42 is connected to the power source pad 15, and the lower electrode 43 is connected to the first-stage amplifier circuit 11.

Thus, because the integrator is formed by using the existing element (the capacitor element), the chip area does not increase.

Figure 6:
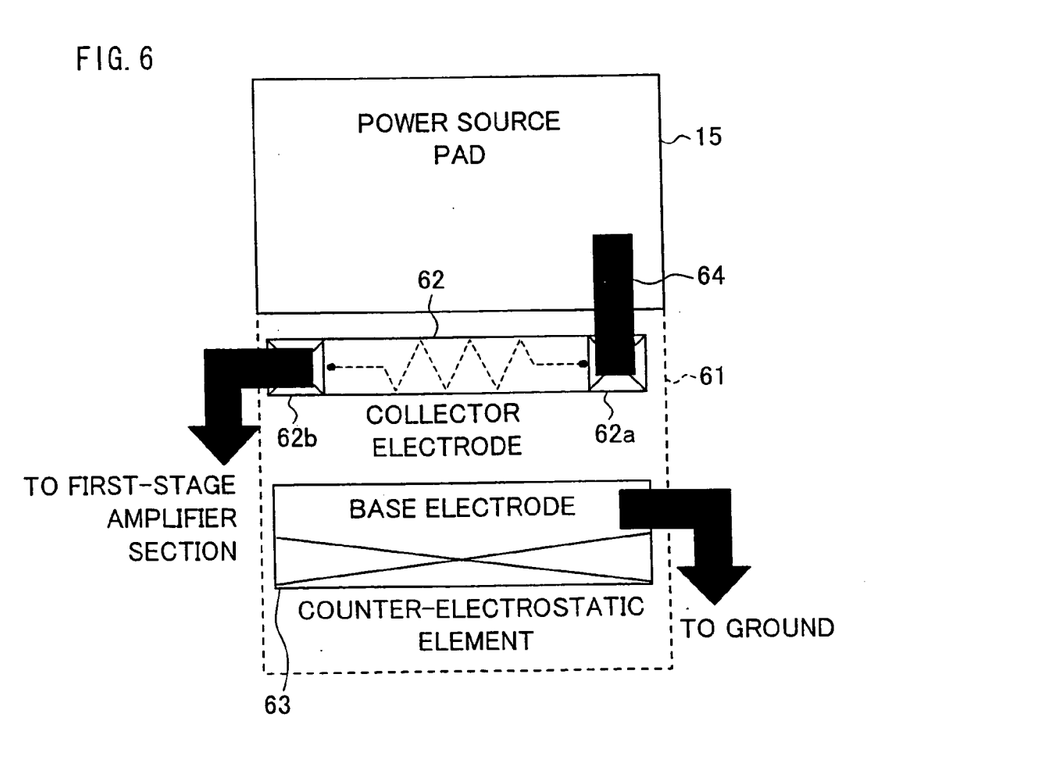
FIG. 6 is a diagram illustrating an arrangement of a main part of a counter-electrostatic element in a case where the counter-electrostatic element is used to form the integrator of the integrated circuit of the present invention.

With reference to FIG. 6, another example of the integrator formed by using an existing element is described below. FIG. 6 is an overhead view of an integrator including a counter-electrostatic element 61 (circuit element other than the integrator in the integrated circuit).

The counter-electrostatic element 61, which is usually provided near each pad (all the pads including the power source pad and the output terminal pad), is a transistor element for protecting an internal circuit from being destroyed by external static electricity. A collector electrode 62 of the counter-electrostatic element 61 is a diffusion region. Therefore, if electrodes 62a and 62b are respectively formed at both ends of the collector electrode 62, the collector electrode 62 can be used as the resistor section of the integrator.

In the arrangement of FIG. 6, the electrode 62a is connected to the power source pad 15, and the electrode 62b is connected to the first-stage amplifier circuit 11. If a plurality of power source pads 15 are provided, each power source pad 15 supplies power to the amplifier circuits corresponding thereto.

In the case, the capacitor section of the integrator can be formed by using the upper electrode 47, the upper metal region 46, the insulating layer 45, the lower metal region 41, and the lower electrode 42, as in the case of FIG. 5(a).

Thus, the integrator for stabilizing the circuit operation can be provided without increasing the chip area of the light-receiving amplifier element. As a result, it is possible to miniaturize an optical pickup device which attains high reproduction accuracy.

Incidentally, a resistance of a pickup element or the like used in an optical pickup device is usually on the order of kilo ohms. On the other hand, a resistance of such a resistor element that is used in the integrator is approximately tens of ohms (approximately 30Ω to 70Ω). Therefore, it is difficult to provide such a resistor element as a separate entity on the same chip.

However, if an existing element (the capacitor element or the counter-electrostatic element) is used as the integrator as shown in FIGS. 5(a), 5(b), and 6, a low-resistance resistor element can be realized easily. For example, in the case of the capacitor element 40 of FIGS. 5(a) and 5(b), the lower metal region 41 can be used as the resistor section of the integrator, and in the case of the counter-electrostatic element 61 of FIG. 6, the collector electrode 62, which is a diffusion region, can be used as the resistor section of the integrator.

As described above, according to the present invention, the light-receiving amplifier element, which includes (i) plural channels of first-stage amplifier and following stage amplifier and (ii) a common power source pad connected thereto, further includes an integrator provided between the first-stage amplifier and the power source pad, the integrator including a resistor and a capacitor.

This arrangement solves the problem that the rapid voltage fluctuation caused at the output terminal of the first-stage amplifier destabilizes the circuit arrangement.

According to the present invention, an existing element (the capacitor element or the counter-electrostatic element) is used to form the integrator within the chip, so that it is not necessary to increase the chip area. This allows for miniaturization and cost reduction demanded by the market. The effect of decreasing the coupling noise is especially useful for an element (typically an optical pickup element) having a high frequency characteristic.

Although the present embodiment has described the light-receiving amplifier element used in the optical pickup device, this is only one example. The present invention may be applied to any integrated circuit, if (i) the integrated circuit includes plural amplifies receiving power supply from a common power source pad, and (ii) an integrator can be provided between the first-stage amplifier and the power source pad.

For example, the present invention can be applied to an integrated circuit which can be mounted on various electronic devices having a function of receiving and processing a high-frequency signal. Examples of such electronic devices are radio receiving sets, television sets, portable phones, cordless phones, Bluetooth (a short-distance wireless data communication technology), wireless LAN, car navigation systems, and game machines having a communication function.

The noise reducing means is not limited to the integrator 20. The noise reducing means may be any means for cutting a noise (especially such a noise that adversely affects the following-stage amplifier circuit) generated in the first-stage amplifier circuit 11. If the noise reducing means is not limited to the integrator 20, there is more freedom in designing the integrated circuit, because it is not necessary to provide the noise reducing means between the first-stage amplifier circuit 11 and the power source pad 15.

The optical pickup device is used in optical disc recording and reproducing devices and optical disc reproducing devices. More specifically, the optical pickup device is used in MD (Mini Disc) devices, portable CD (Compact Disc) players, CD-R/RW devices, DVD±R/RW devices, DVD players, and car navigation systems using DVD players. The present invention can be applied to any of these devices.

By setting a resistance of the resistor in the noise reducing means of the present invention to be between 30Ω and 70Ω, it is possible to form the integrator by using the existing element of the integrated circuit.

For example, the resistor can be a diffusion region of a semiconductor layer, the semiconductor layer being a part of another circuit element of the integrated circuit, the diffusion region having electrodes respectively at both ends.

The diffusion region may correspond to a lower electrode of a capacitor element, the capacitor element being the aforesaid another circuit element, or may be included in a collector electrode of a counter-electrostatic element, the counter-electrostatic element being aforesaid another circuit element.

By thus forming the integrator by using an existing element, the integrator can be miniaturized as compared with the case where the integrator is provided separately. For example, in the case of an IC chip, the integrator can be added without increasing the chip area. As a result, it is possible to provide a high-performance and small IC chip.

By connecting a light-receiving element to an input terminal of the first-stage amplifier among the plurality of amplifiers, it is possible to use the integrated circuit of the present invention as the light-receiving amplifier element.

The integrated circuit of the present invention may include a plurality of amplifiers connected in series, power supply lines connected to a common power source, the power supply lines respectively supplying power to the amplifiers, and an integrator connected to the power supply line which connects the power source and the first-stage amplifier among the amplifiers.

An optical pickup device of the present invention may include the integrated circuit and the light-receiving element connected to the input terminal of the first-stage amplifier.

With this arrangement, the coupling noise generated in the first-stage amplifier is absorbed by the integrator electrically connected between the power source and the first-stage amplifier. Therefore, a next-stage amplifier and every following amplifier, which are connected to the common power source, do not receive the coupling noise.

Thus, the coupling noise generated in the first-stage amplifier does not destabilize the circuit operation of the following-stage amplifier. As a result, the operation of the integrated circuit as a whole is stabilized.

Therefore, in the optical pickup device, when a received optical signal is converted into an electrical signal, the electrical signal is appropriately outputted from the integrated circuit. As a result, various kinds of control can be performed at high accuracy, in accordance with the received optical signal.

Examples of the various kinds of control are focusing control and tracking control.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit, comprising:
   a plurality of amplifiers connected in series;
   power supply lines connected to a common power source, the power supply lines respectively supplying power to the amplifiers; and
   a noise reducer comprising an integrator including a resistor and a capacitor electrically connected to a power supply line between the power source and a first amplifier for reducing a noise generated in the first amplifier among the amplifiers.

2. The integrated circuit as set forth in claim 1, wherein the capacitor has one end connected to the power supply line between the resistor and the first amplifier and whose other end is ground.

3. The integrated circuit as set forth in claim 1, wherein:
   a resistance of the resistor of the integrator is set to be between 30Ω and 70Ω.

4. The integrated circuit as set forth in claim 1, wherein:
   the resistor of the integrator is a diffusion region of a semiconductor layer of a capacitor element, the capacitor element being provided as a spare in the integrated circuit, the diffusion region having electrodes respectively at both ends.

5. The integrated circuit as set forth in claim 1, wherein:
   the resistor of the integrator is a diffusion region of a semiconductor layer, the semiconductor layer being a part of another circuit element of the integrated circuit, the diffusion region having an electrode connected to the power source and an electrode connected to the first amplifier.

6. The integrated circuit as set forth in claim 1, wherein:
   an input terminal of the first amplifier is connected to a light-receiving element.

7. An optical pickup device, comprising:
   an integrated circuit including (i) a plurality of amplifier connected in series, (ii) power supply lines connected to a common power source, the power supply lines respectively supplying power to the amplifiers, and (iii) a noise reducer comprising an integrator including a resistor and capacitor electrically connected to a power supply line between the power source and a first amplifier for reducing a noise generated in the first amplifier among the amplifier; and
   a light-receiving element connected to an input terminal of the first amplifier.

8. An optical disc recording and reproducing device, comprising:
   an optical pickup device including
   an integrated circuit including (i) a plurality of amplifiers connected in series, (ii) power supply lines respectively supplying power to the amplifiers, and (iii) a noise reducer comprising an integrator including a resistor and a capacitor electrically connected to a power supply line between the power source and a first amplifier for reducing a noise generated in the first amplifier among the amplifiers, and
   light-receiving element connected to an input terminal of the first amplifier.

9. An optical disc reproducing device, comprising:
   an optical pickup device including
   an integrated circuit including (i) a plurality of amplifiers connected in series, (ii) power supply lines connected to a common power source, the power supply lines respectively supplying power to the amplifiers, and (iii)

a noise reducer comprising an integrator including a resistor and a capacitor electrically connected to a power supply line between the power source and a first amplifier for reducing the noise generated in the first amplifier among the amplifiers, and a light-receiving element connected to an input terminal of the first-stage amplifier.

10. An integrated circuit, comprising:

a plurality of amplifiers connected in series;

power supply lines connected to a common power source, the power supply lines respectively supplying power to the amplifier; and a noise reducer for reducing a noise generated in a first amplifier among the amplifiers, and said noise reducer being connected to one of said power supply lines between said power source and the first amplifier;

wherein the noise reducer includes an integrator including a resistor and a capacitor, the resistor is a diffusion region of a semiconductor layer, the semiconductor layer being part of another circuit element of the integrated circuit, the diffusion region having electrodes respectively at both ends.

11. The integrated circuit as set forth in claim 10, wherein:

a resistance of the resistor is set between 30Ω and 70Ω.

12. The integrated circuit as set forth in claim 10, wherein:

the resistor is a diffusion region of a semiconductor layer of a capacitor element, the capacitor element being provided as a spare in the integrated circuit.

13. The integrated circuit as set forth in claim 10, wherein:

the diffusion region has an elecirode connected to the power source and an electrode connected to the first amplifier.

14. The integrated circuit as set forth in claim 10, wherein:

the diffusion region corresponds to a lower electrode of a capacitor element, the capacitor element being said another circuit element.

15. The integrated circuit as set forth in claim 10, wherein:

the diffusion region is included in a collector electrode of a counter-electrostatic element, the counter-electrostatic element being said another circuit element.

* * * * *